(12) United States Patent  
Hsu et al.

(10) Patent No.: US 8,125,761 B2  
(45) Date of Patent: Feb. 28, 2012

(54) CAPACITOR DEVICES WITH CO-COUPLING ELECTRODE PLANES

(75) Inventors: Chien-Min Hsu, Taipei County (TW); Min-Lin Lee, Hsinchu (TW); Shinn-Juh Lai, Hsinchu County (TW); Chen-Hsuan Chiu, Taipei (TW)

(73) Assignee: Industrial Technology Research Institute, Chutung, Hsinchu (TW)

( * ) Notice: Subject to any disclaimer, the term of this patent is extended or adjusted under 35 U.S.C. 154(b) by 478 days.

(21) Appl. No.: 12/390,237

(22) Filed: Feb. 20, 2009

(65) Prior Publication Data

US 2009/0213526 A1 Aug. 27, 2009

Related U.S. Application Data

(60) Provisional application No. 61/030,918, filed on Feb. 22, 2008.

(51) Int. Cl.
*H01G 4/00* (2006.01)

(52) U.S. Cl. ............ 361/306.1; 361/301.4; 361/306.2; 361/308.1; 361/306.3; 361/763

(58) Field of Classification Search ............ 361/301.4, 361/306.2, 308.1, 306.3, 303, 748, 763, 830, 361/766; 257/E23.062
See application file for complete search history.

(56) References Cited

U.S. PATENT DOCUMENTS

| 6,532,143 B2 * | 3/2003 | Figueroa et al. ............ 361/301.4 |
| 6,678,145 B2 * | 1/2004 | Naito et al. ............... 361/308.1 |
| 7,345,366 B2 | 3/2008 | Jow et al. |
| 2007/0062726 A1 | 3/2007 | Chang et al. |

FOREIGN PATENT DOCUMENTS

CN 1905099 A 1/2007

OTHER PUBLICATIONS

Chien-Min Hsu et al., U.S. Appl. No. 12/392,272, filed Feb. 25, 2009.
Huey-Ru Chang et al., U.S. Appl. No. 12/395,065, filed Feb. 27, 2009.
Chinese Office Action of corresponding Chinese Application No. 200910126781.8 dated Nov. 12, 2010.

* cited by examiner

*Primary Examiner* — Tuan T Dinh
*Assistant Examiner* — Hung Dang
(74) *Attorney, Agent, or Firm* — Finnegan, Henderson, Farabow, Garrett & Dunner, LLP

(57) ABSTRACT

A capacitive module is provided. The capacitive module may include a first capacitor including a first electrode and a second electrode, one of the first electrode and the second electrode being coupled to at least one first conductive via and the other one of the first electrode and the second electrode being coupled to at least one second conductive via. The capacitive module may also include a second capacitor spaced apart from the first capacitor, the second capacitor including a third electrode and a fourth electrode, one of the third electrode and the fourth electrode being coupled to the at least one first conductive via and the other one of the third electrode and the fourth electrode being coupled to the at least one second conductive via. Furthermore, the capacitive module may include a first conductive plane being electrically coupled to a first plane with a first polarity through one of the at least one first conductive via and a second conductive plane being electrically coupled to a second plane with a second polarity, opposite to the first polarity, through one of the at least one second conductive via.

23 Claims, 17 Drawing Sheets

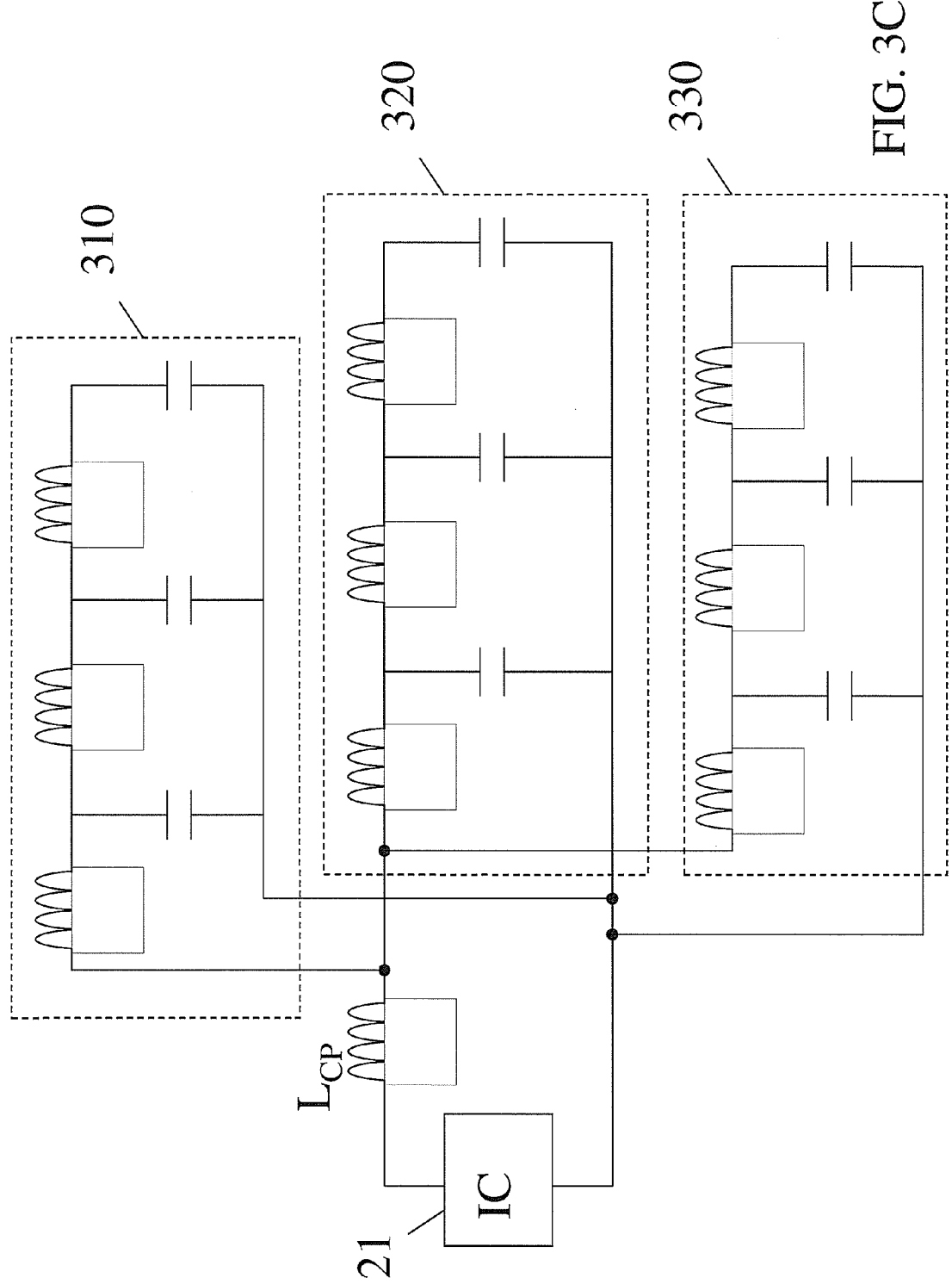

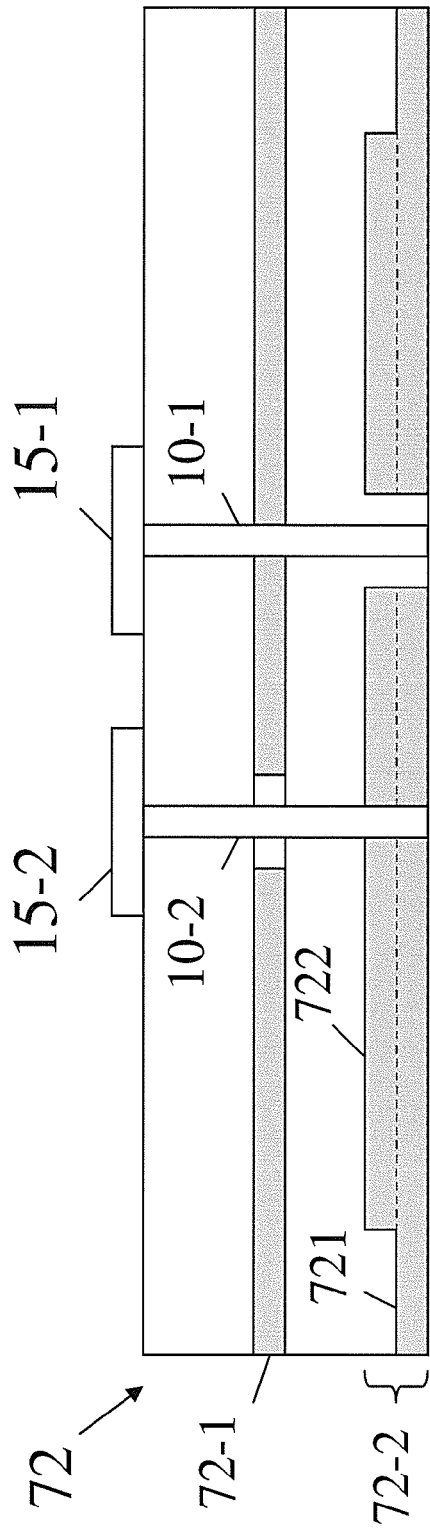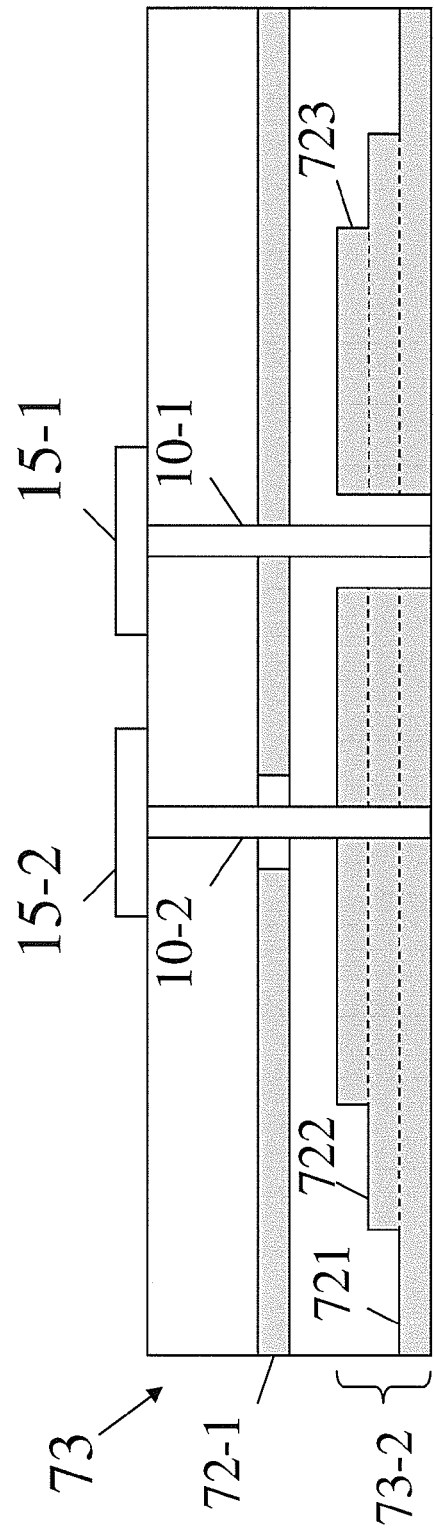
FIG. 6A
FIG. 6B

CAPACITOR DEVICES WITH CO-COUPLING ELECTRODE PLANES

CROSS-REFERENCE TO RELATED APPLICATIONS

This application claims the benefit of priority from U.S. Provisional Application No. 61/030,918, filed Feb. 22, 2008, the entire contents of which is hereby incorporated by reference in its entirety.

TECHNICAL FIELD

Embodiments disclosed herein relate to a capacitor device and, more particularly, to a capacitor device having one or more pairs of co-coupling electrode planes.

BACKGROUND

In general, decoupling capacitors, such as surface mounted device (SMD) capacitors, are disposed close to power/ground pins of electronic devices on printed circuit boards (PCBs) or the substrates of integrated circuits (ICs) to reduce undesirable noises. Capacitors are electrical devices capable of storing or absorbing electrical charges in time. That is, decoupling capacitors may provide a localized source of direct-current (DC) power for electronic devices as the signals switch simultaneously at high speed.

With the increase in signal transmission speed in ICs, unexpected interference resulting from power noises, ground bounces or simultaneous switching noises (SSN) may be serious and therefore may not be neglected for designers. However, parasitic inductances induced by conductive traces may become higher for SMD decoupling capacitors as the electronic devices operate at a high frequency. Accordingly, it may be difficult for SMD decoupling capacitors to stabilize power supply level. Additionally, SMD capacitors mounted on a PCB requires certain board space and may limit the board space available for other devices. To deal with the above problems, decoupling capacitors embedded in PCBs or the substrates of ICs may sometimes be used in power delivery network.

Embedded capacitors, which may refer to capacitors embedded or buried in a PCB, IC substrate or interposer, have been proposed to replace the SMD capacitors for eliminating switching noise. However, capacitors embedded in PCBs or the substrates of ICs, may also exhibit more inductive than capacitive when they operate at a frequency greater than its resonant frequency. That is, the impedance of the embedded capacitors may increase as the operating frequency increases, resulting in degeneration of the decoupling performance for a power delivery network. As a result, how to reduce the impedance of the embedded capacitors and broaden the decoupling bandwidth are possible considerations in power integrity design.

BRIEF SUMMARY

Consistent with the disclosed embodiments, there is provided a capacitive module, including a first capacitor including a first electrode and a second electrode, one of the first electrode and the second electrode being coupled to at least one first conductive via and the other one of the first electrode and the second electrode being coupled to at least one second conductive via a second capacitor spaced apart from the first capacitor, the second capacitor including a third electrode and a fourth electrode, one of the third electrode and the fourth electrode being coupled to the at least one first conductive via and the other one of the third electrode and the fourth electrode being coupled to the at least one second conductive via, and a first conductive plane being electrically coupled to a first plane with a first polarity through one of the at least one first conductive via.

Consistent with the disclosed embodiments, there is also provided a capacitive module including a first electrode having a first polarity; a second electrode formed below the first electrode and having a second polarity, the second polarity being opposite to the first polarity, a third electrode electrically coupled to the first electrode through a first conductive via, a fourth electrode formed below the third electrode and being electrically coupled to the second electrode through a second conductive via, and a first conductive plane electrically coupled to the first electrode through the first conductive via.

Additional descriptions of the disclosed embodiments will be set forth in part in the description which follows, and in part will be obvious from the description, or may be learned by practice of the invention.

It is to be understood that both the foregoing general description and the following detailed description are exemplary and explanatory only and are not restrictive of the disclosed embodiments, as claimed.

BRIEF DESCRIPTION OF THE DRAWINGS

The foregoing summary, as well as the following detailed description of the disclosed embodiments, will be better understood when read in conjunction with the appended drawings. For the purpose of illustrating the disclosed embodiments, there are shown in the drawings examples that are presently preferred. It should be understood, however, that the invention is not limited to the precise arrangements and instrumentalities shown.

In the drawings:

FIG. 3C is a diagram of an equivalent circuit of the capacitor module illustrated in FIG. 3A;

FIG. 6A illustrates yet another capacitor module shown from a cross-sectional view according to a disclosed embodiment;

FIG. 6B illustrates still another capacitor module shown from a cross-sectional view according to a disclosed embodiment;

DETAILED DESCRIPTION OF THE DISCLOSED EMBODIMENTS

Reference will now be made in detail to disclosed embodiments illustrated in the accompanying drawings. Wherever possible, the same reference numbers will be used throughout the drawings to refer to the same or like portions. It should be noted that the drawings are in greatly simplified form and are not to precise scale. In reference to the disclosure herein, for purposes of convenience and clarity only, directional terms, such as top and bottom, are used with respect to the accompanying drawings. Such directional terms used in conjunction with the following description of the drawings should not be construed to limit the scope of the invention in any manner not explicitly set forth in the appended claims.

Figure 1A:
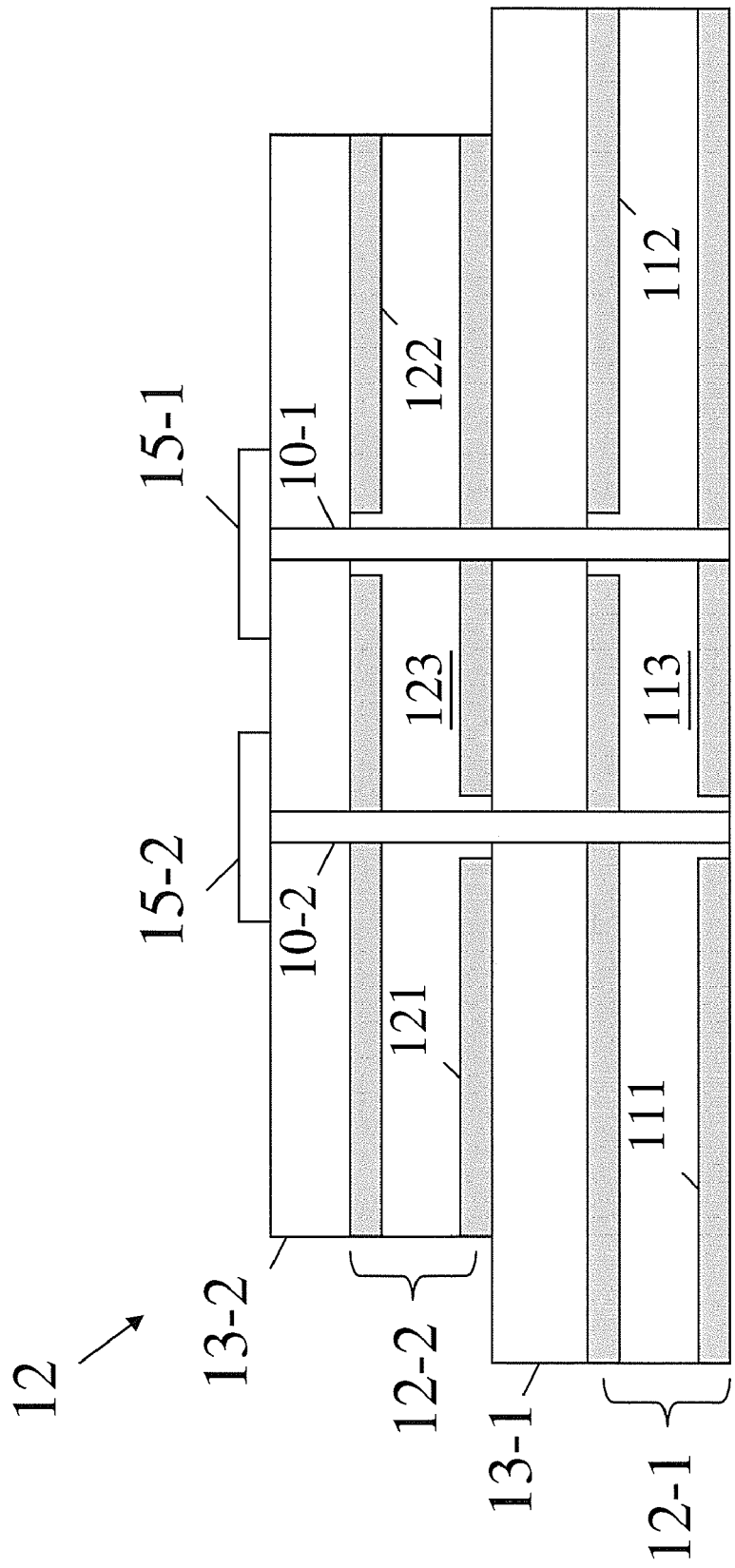
FIG. 1A illustrates a capacitor module shown from a cross-sectional view according to a disclosed embodiment.

FIG. 1A illustrates a capacitive module 12 shown from a cross-sectional view. Referring to FIG. 1A, the capacitive module 12 may include a multi-stack capacitive structure, which may be embedded or buried in a substrate or an interposer of chips to form a capacitive device. As used herein, a substrate may be, for example, a circuit board such as a printed circuit board (PCB). A substrate may also comprise organic and inorganic materials, for example a ceramic, metal, glass or semiconductor materials. The capacitive module 12 may include a first capacitor 12-1, a second capacitor 12-2 and one or more pair of conductive planes including a first conductive plane 15-1 and a second conductive plane 15-2 in accordance with embodiments of the present invention. First capacitor 12-1 and the second capacitor 12-2 may include planar capacitors. First capacitor 12-1 may be separated from second capacitor 12-2 by a first insulating layer 13-1. Similarly, second capacitor 12-2 may be separated from the pair of conductive planes 15-1 and 15-2 by a second insulating layer 13-2. In the present example, the pair of conductive planes 15-1 and 15-2 may be positioned above second capacitor 12-2. Second capacitor 12-2 may be positioned above first capacitor 12-1. Furthermore, each of conductive planes 15-1 and 15-2 may include a patterned conductive layer.

First capacitor 12-1 may include a first electrode 111, a second electrode 112 and an insulating layer 113 located between first and second electrodes 111 and 112. The polarity of first electrode 111 may be opposite to that of second electrode 112. First electrode 111 may be electrically coupled to first conductive plane 15-1 through a first conductive via 10-1, while second electrode 112 may be electrically coupled to second conductive plane 15-2 through a second conductive via 10-2. Similarly, second capacitor 12-2 may include a first electrode 121, a second electrode 122 and an insulating layer 123 located between the first and second electrodes 121 and 122. Likewise, first electrode 121 may be electrically coupled to first conductive plane 15-1 through first conductive via 10-1, while second electrode 122 may be electrically coupled to second conductive plane 15-2 through second conductive via 10-2.

First capacitor 12-1 may provide a first capacitance $C_1$, while second capacitor 12-2 may provide a second capacitance $C_2$. As an example of first capacitor 12-1, first capacitance $C_1$ may depend on an effective capacitive area defined by first and second electrodes 111 and 112 and the insulating material in insulating layer 113. Assuming that the insulating materials in insulating layers 113 and 123 have substantially the same dielectric constant, in the present example, first capacitance $C_1$ may be greater than second capacitance $C_2$ because the effective capacitive area of first capacitor 12-1 is greater than that of second capacitor 12-2.

Figure 1B:
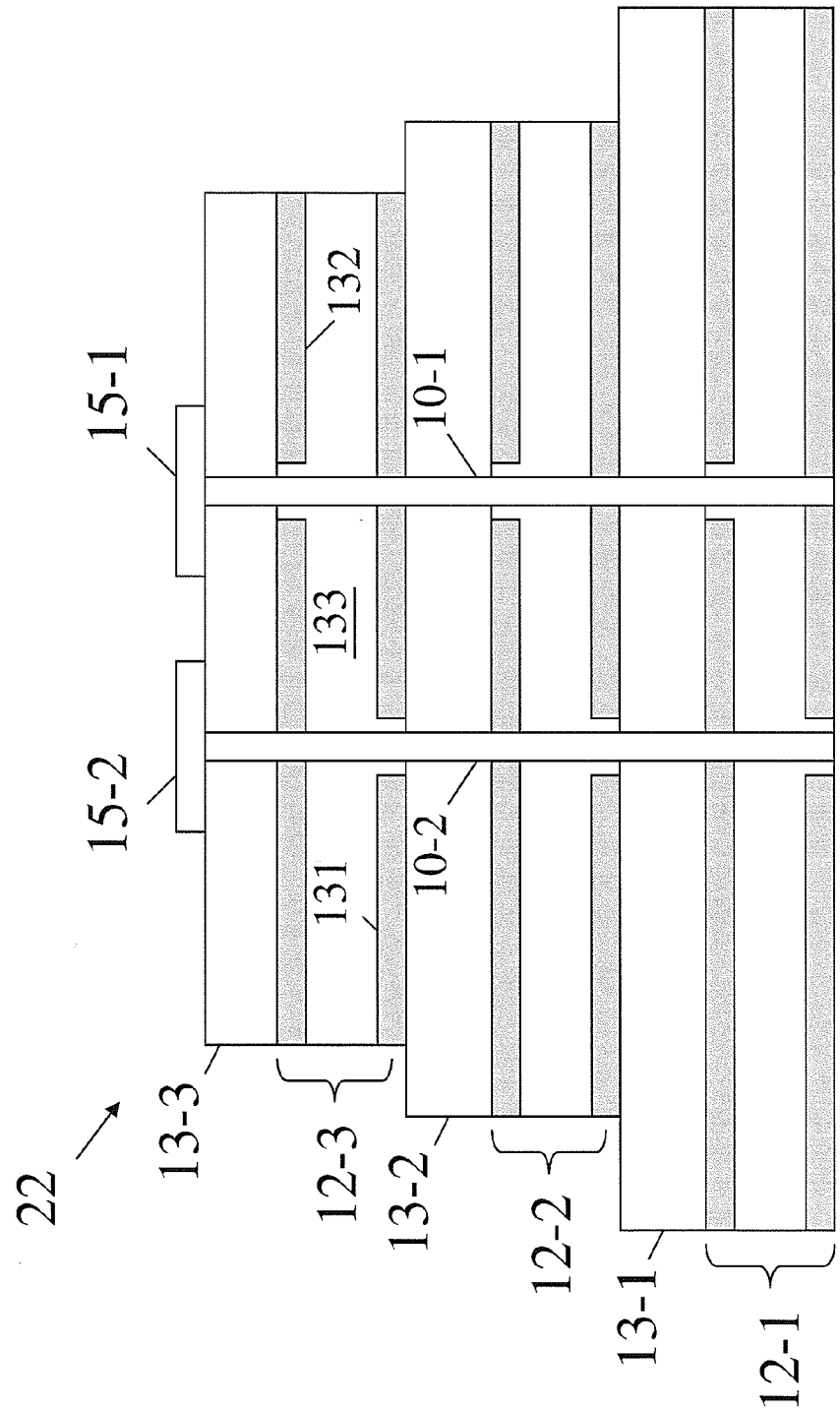
FIG. 1B illustrates another a capacitor module shown from a cross-sectional view according to a disclosed embodiment.

FIG. 1B illustrates another capacitive module 22 shown from a cross-sectional view. Referring to FIG. 1B, capacitive module 22 may be similar to the capacitive module 12 described and illustrated with reference to FIG. 1A except that, for example, a third capacitor 12-3 may be added. Third capacitor 12-3 may include a planar capacitor. Third capacitor 12-3, located between second capacitor 12-2 and the pair of conductive planes 15-1 and 15-2, may be separated from second capacitor 12-2 by second insulating layer 13-2 and separated from the pair of conductive planes 15-1 and 15-2 by a third insulating layer 13-3. Furthermore, third capacitor 12-3 may include a first electrode 131, a second electrode 132 and an insulating layer 133 located between the first and second electrodes 131 and 132. Likewise, first electrode 131 may be electrically coupled to first conductive plane 15-1 through first conductive via 10-1, while second electrode 132 may be electrically coupled to second conductive plane 15-2 through second conductive via 10-2. In one example, third capacitor 12-3 may provide a third capacitance $C_3$, which may be smaller than second capacitance $C_2$. Capacitive module 22 may therefore provide multi-capacitance for different applications. For example, first capacitor 12-1, having the largest capacitance $C_1$, may be suitable for eliminating or reducing low-frequency noise. Furthermore, third capacitor 12-3, having the smallest capacitance $C_3$, may be suitable for eliminating or reducing high-frequency noise. Moreover, second capacitor 12-2, having a capacitance $C_2$ wherein $C_1 > C_2 > C_3$, may be suitable for eliminating or reducing medium-frequency noise.

Figure 2A:
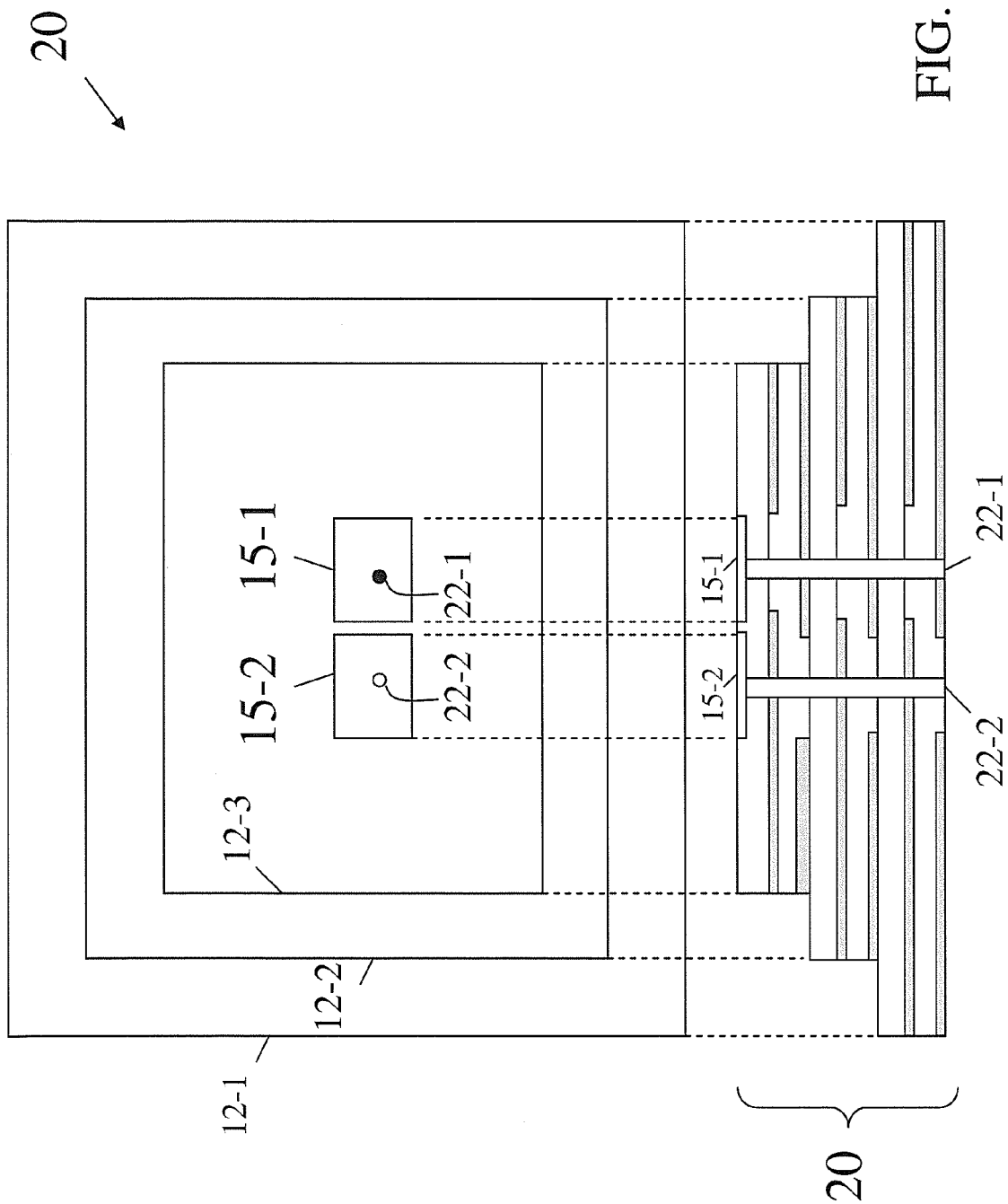
FIG. 2A is a schematic top view of a capacitor module according to according to a disclosed embodiment.

FIG. 2A is a schematic top view of a capacitive module 20 according to a disclosed embodiment. Capacitive module 20 may include three planar capacitors stacked upon one another. The 3-stacked capacitive structure may be similar to that of capacitive module 22 described and illustrated with reference to FIG. 1B. Referring to FIG. 2A, first conductive plane 15-1 may be electrically isolated from second conductive plane 15-2. First conductive plane 15-1 may provide a first coupling region for the multi-stacked capacitors through one or more first conductive vias 22-1. Each of one or more first conductive vias 22-1 may extend from first conductive plane 15-1 to, for example, a power plane (not shown in FIG. 2A). Furthermore, second conductive plane 15-2 may provide a second coupling region for the multi-stacked capacitors through one or more second conductive vias 22-2. Each of the one or more second conductive vias 22-2 may extend from second conductive plane 15-2 to, for example, a ground plane (not shown in FIG. 2A). In one example according to the present invention, the first and second conductive planes 15-1 and 15-2 may be located below a common coupling area of a circuit board. An example of the common coupling area may be found in U.S. provisional patent application No. 60/718, 413, entitled "Embedded Capacitor Devices Having a Common Coupling Area," (the '413 application") filed on Sep. 19, 2005, assigned to the same assignee and incorporated herein by reference.

Figure 2B:
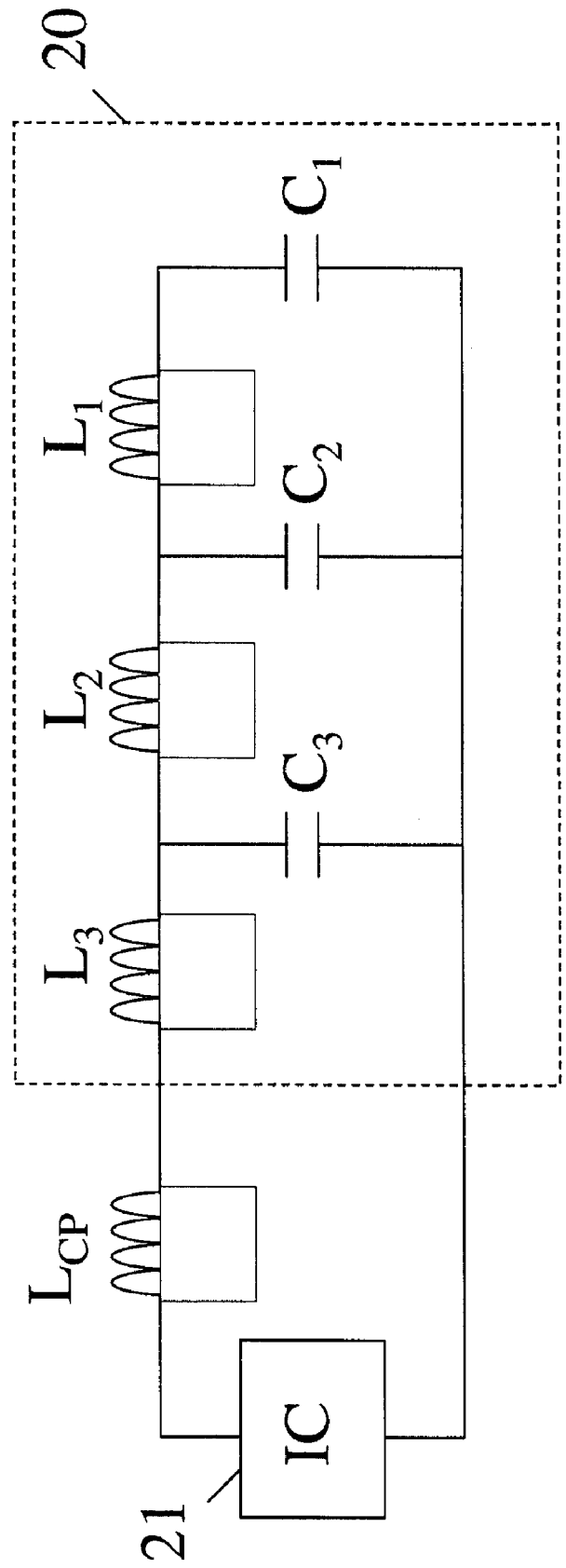
FIG. 2B is a diagram of an equivalent circuit of the capacitor module illustrated in FIG. 2A.

FIG. 2B is a diagram of an equivalent circuit of the capacitive module 20 illustrated in FIG. 2A. Referring to FIG. 2B, the 3-stack capacitive structure capacitive module 20 may provide capacitances $C_1$, $C_2$ and $C_3$ for the load of an electronic component 21, for example an integrated circuit (IC), as illustrated in FIG. 2B. A parasitic inductance $L_{CP}$ may be induced by first conductive plane 15-1 and second conductive plane 15-2. Due to the length of electrical current paths from capacitors 12-1, 12-2 and 12-3 to the electronic component 21, illustrated as an IC in the accompanying figures, through conductive vias 22-1 and 22-2, inductance effects may occur. Furthermore, due to differences in length of the electrical current paths, inductances $L_1$, $L_2$ and $L_3$ respectively associated with capacitances $C_1$, $C_2$ and $C_3$ may be different. Generally, the longer the electrical current path, the greater the inductance. In the present example, $L_1$ may be the greatest inductance while $L_3$ may be the smallest inductance because first capacitor 12-1 has the longest path and third capacitor 12-3 has the shortest path with respect to electronic component 21. With the multi-stacked capacitive structure, capacitances $C_1$, $C_2$ and $C_3$ may be coupled in parallel with one another as the inductances $L_1$, $L_2$ and $L_3$ are neglected. Moreover, with conductive planes 15-1 and 15-2 coupled to the power plane and the ground plane through the one or more first and second conductive vias 22-1 and 22-2, respectively, magnetic flux induced by opposite current loops may be canceled out, resulting in further reducing the resultant inductance, illustrated as $L_{CP}$ in FIG. 2B.

Figure 3A:
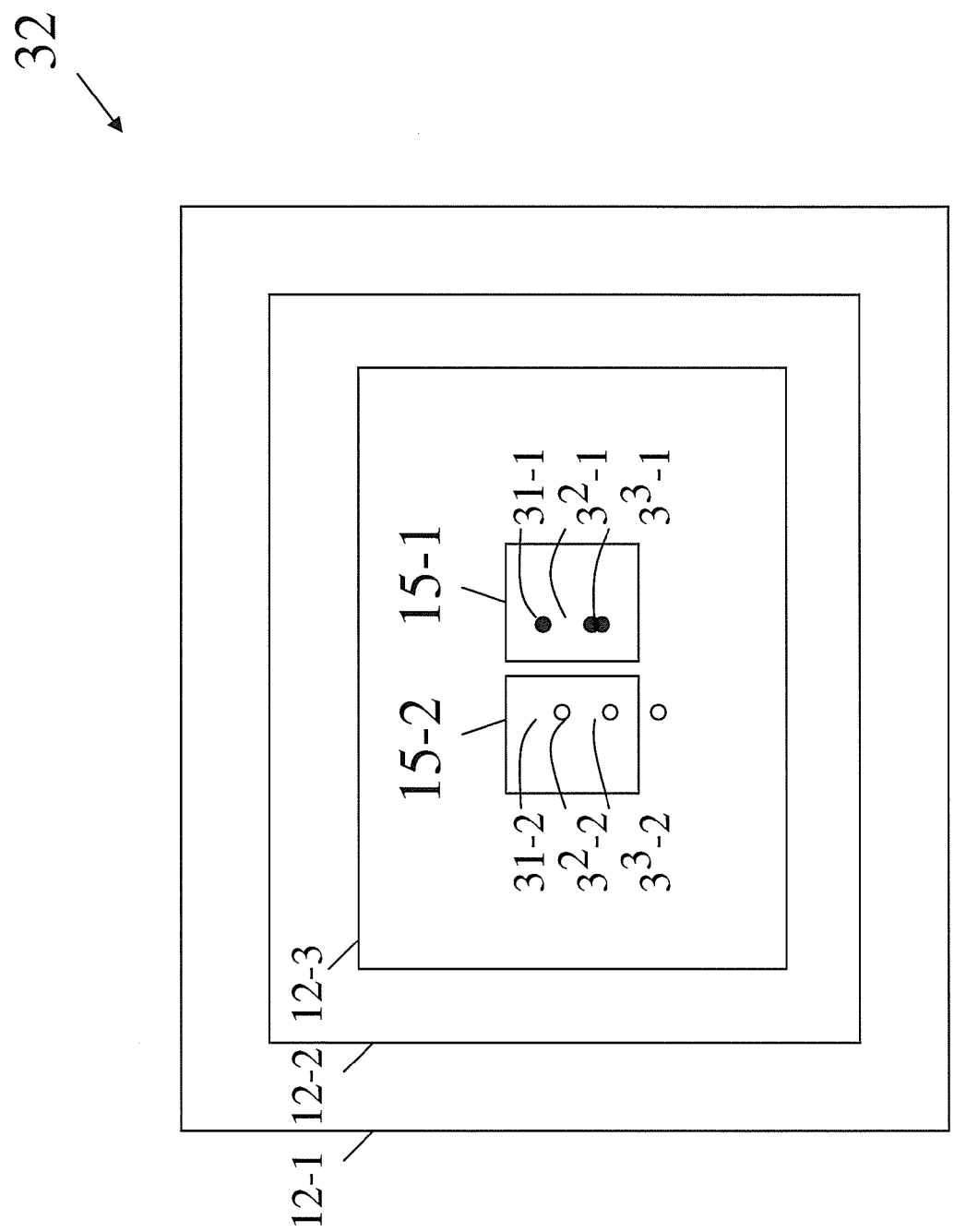
FIG. 3A is a schematic top view of a capacitor module according to according to a disclosed embodiment.

FIG. 3A is a schematic top view of a capacitive module 32 according to a disclosed embodiment. Referring to FIG. 3A, capacitive module 32 may be similar to capacitive module 20 described and illustrated with reference to FIG. 2A except that, for example, a first pair of conductive vias 31-1 and 31-2, a second pair of conductive vias 32-1 and 32-2 and a third pair of conductive vias 33-1 and 33-2 are provided. Specifically, conductive vias 31-1, 32-1 and 33-1 are electrically coupled to first conductive plane 15-1 having the first polarity, and conductive vias 31-2, 32-2 and 33-2 are electrically coupled to second conductive plane 15-2 having the second polarity. Each of the first, second and third pairs of conductive vias 31-2, 32-2 and 33-2 may be electrically coupled to a multi-stacked capacitive structure such as the 2-stack capacitive structure 12 in FIG. 1A, the 3-stack capacitive structure 22 in FIG. 1B or a capacitive structure having four or more capacitors stacked upon one another.

Figure 3B:
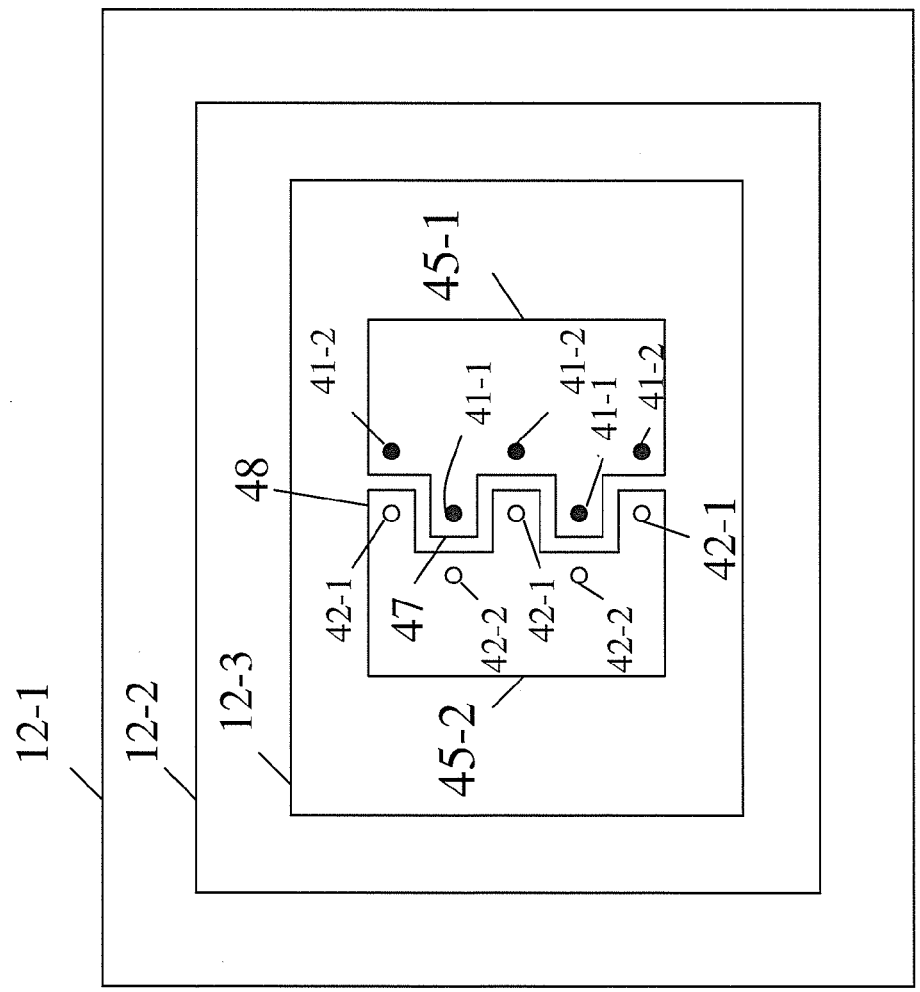
FIG. 3B is a schematic top view of a capacitor module according to another disclosed embodiment.

FIG. 3B is a schematic top view of a capacitive module 42 according to another disclosed embodiment. Referring to FIG. 3B, capacitive module 42 may be similar to capacitive module 32 described and illustrated with reference to FIG. 3A except, for example, the configuration of a pair of conductive planes 45-1 and 45-2 and the arrangement of conductive vias. Specifically, first conductive plane 45-1 and second conductive plane 45-2 may include finger tabs 47 and 48, respectively. Finger tabs 47 and 48 may be interdigitated with each other. Furthermore, a first row of conductive vias 41-1 and a second row of conductive vias 41-2 may be electrically coupled to the first conductive plane 45-1 having the first polarity. Similarly, a first row of conductive vias 42-1 and a second row of conductive vias 42-2 may be electrically coupled to second conductive plane 45-2 having the second polarity opposite to the first polarity. The first row of conductive vias 41-1 may pass through finger tabs 47. Similarly, the first row of conductive vias 42-1 may pass through finger tabs 48. In one example, the first row of conductive vias 41-1 at finger tabs 47 may be aligned with the first row of conductive vias 42-1 passing through finger tabs 48, which may facilitate the cancelling of magnetic flux induced from conductive vias 41-1 and 42-1 when one of the conductive vias 41-1 and one of the conductive vias 42-1 are taken as a pair. In another example, each of the first row of conductive vias 41-1 passing through finger tabs 47 of first conductive plane 45-1 may be arranged close to one of the second row of conductive vias 42-2 passing through second conductive plane 45-2, which may facilitate the cancelling of magnetic flux induced from conductive vias 41-1 and 42-2 when one of the conductive vias 41-1 and one of the conductive vias 42-2 are taken as a pair. Furthermore, each of the first row of conductive vias 42-1 passing through finger tabs 48 of second conductive plane 45-2 may be arranged close to one of the second row of conductive vias 41-2 passing through first conductive plane 45-1, which may facilitate the cancelling of magnetic flux induced from conductive vias 42-1 and 41-2 when one of the conductive vias 42-1 and one of the conductive vias 41-2 are taken as a pair.

In one example, first conductive plane 45-1 and second conductive plane 45-2 may be arranged closely to confine a magnetic field surrounding the pairs of conductive vias with opposite polarity. Accordingly, magnetic flux induced from the pairs of conductive vias may be canceled out and an inductance associated with the pairs of current loops may be reduced.

FIG. 3C is a diagram of an equivalent circuit of capacitive module 32 illustrated in FIG. 3A. Referring to FIG. 3C and, also referring to FIG. 3A, a first inductor-capacitor (LC) circuit 310 may correspond to the first pair of conductive vias 31-1 and 31-2 respectively coupled to conductive planes 15-1 and 15-2 having opposite polarity. Furthermore, a second LC circuit 320 may correspond to the second pair of conductive vias 32-1 and 32-2, and a third LC circuit 330 may correspond to the third pair of conductive vias 33-1 and 33-2. Through conductive planes 15-1 and 15-2, first, second and third LC circuits 310, 320 and 330 may be electrically coupled in parallel with one another. As a result, the resultant inductance may be reduced.

Figure 4A:
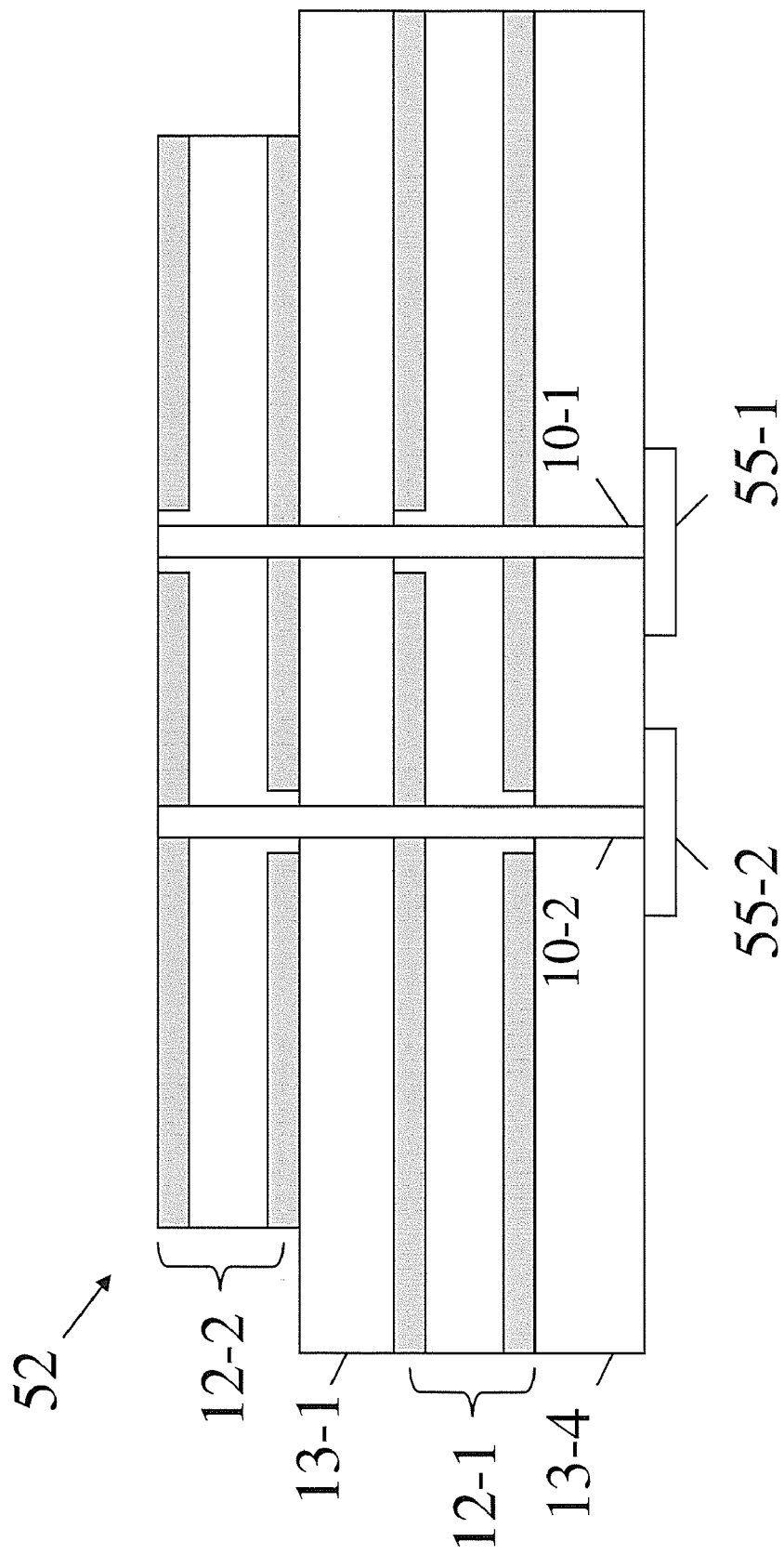
FIG. 4A illustrates another capacitor module shown from a cross-sectional view consistent with the present invention.

FIG. 4A illustrates another capacitive module 52 shown from a cross-sectional view. Referring to FIG. 4A, capacitive module 52 may be similar to the capacitive module 12 described and illustrated with reference to FIG. 1A except that, for example, one or more pairs of conductive planes 55-1 and 55-2 may be located below first capacitor 12-1. Specifically, the one or more pairs of conductive planes 55-1 and 55-2 may be separated from first capacitor 12-1 by at least one insulating layer 13-4 and may respectively be electrically coupled to power planes and ground planes in circuit boards (not shown in FIG. 4A) through conductive vias 10-1 and 10-2.

Figure 4B:
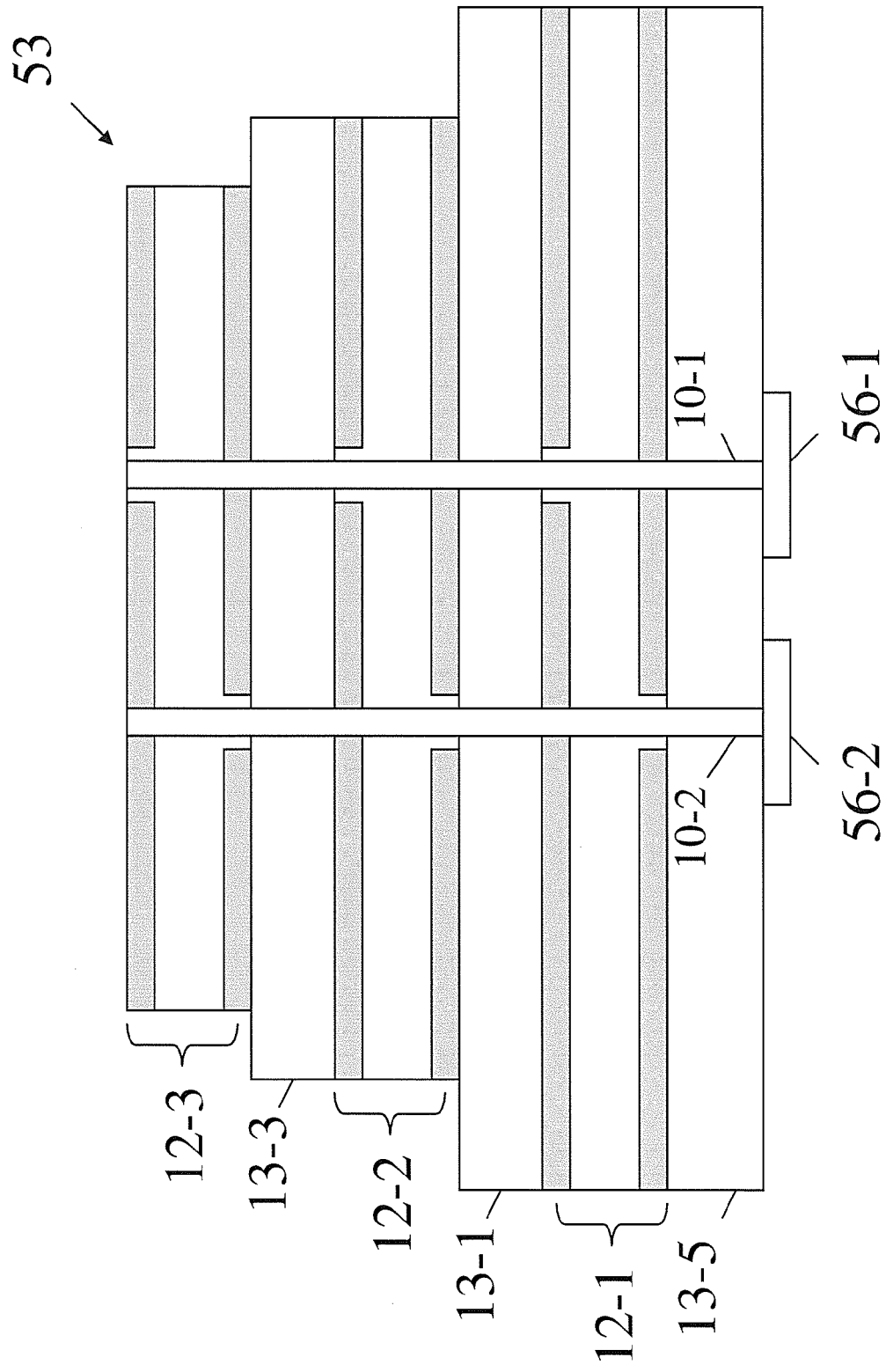
FIG. 4B illustrates yet another capacitor module shown from a cross-sectional view according to a disclosed embodiment.

FIG. 4B illustrates yet another capacitive module 53 shown from a cross-sectional view. Referring to FIG. 4B, capacitive module 53 may be similar to capacitive module 22 described and illustrated with reference to FIG. 1B except that, for example, one or more pairs of conductive planes 56-1 and 56-2 may be located below first capacitor 12-1. Specifically, the one or more pairs of conductive planes 56-1 and 56-2 may be separated from first capacitor 12-1 by at least one insulating layer 13-5 and may respectively be electrically coupled to the power planes and the ground planes in a circuit board (not shown in FIG. 4B) through conductive vias 10-1 and 10-2.

Figure 5A:
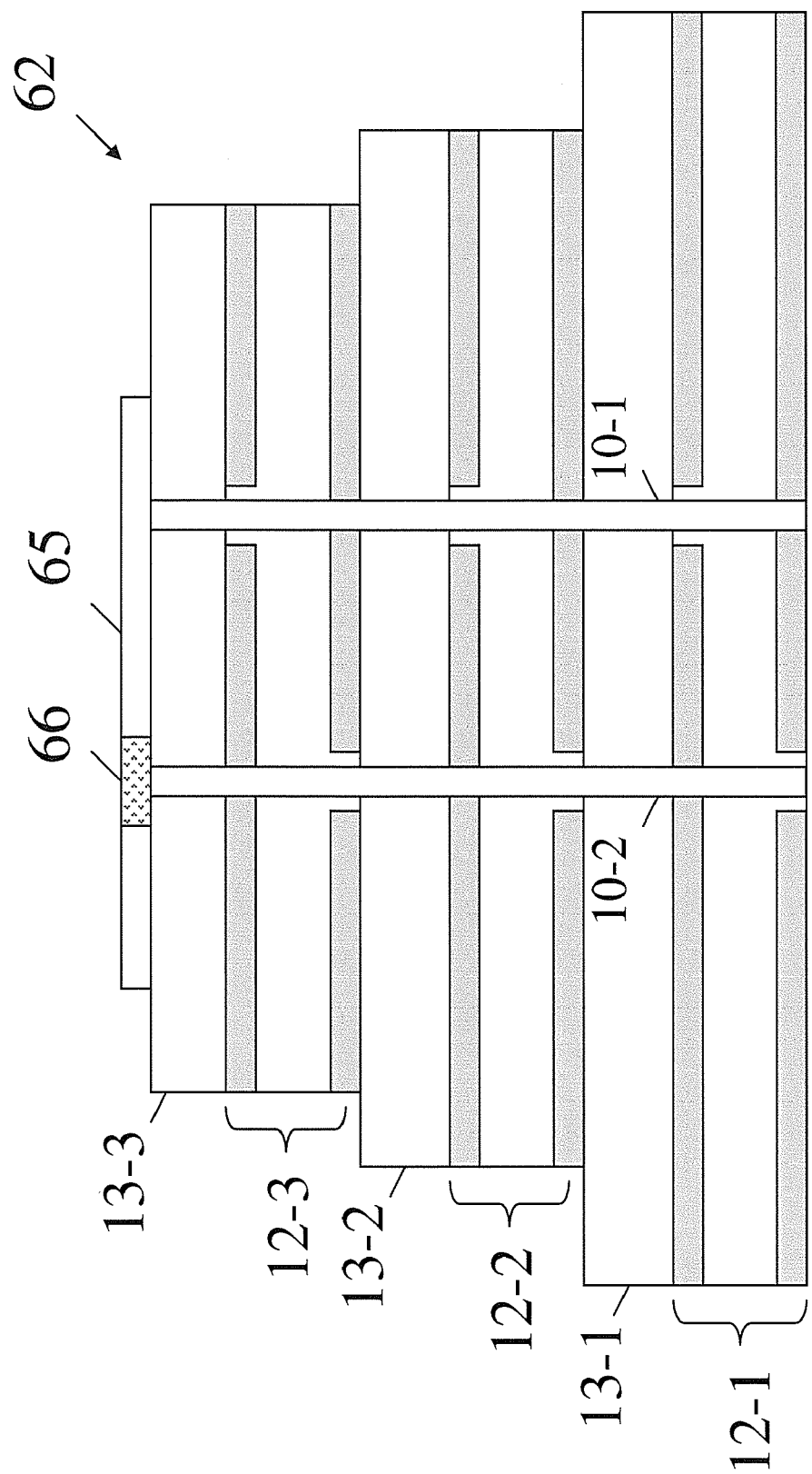
FIG. 5A illustrates yet still another capacitor module shown from a cross-sectional view according to a disclosed embodiment.

FIG. 5A illustrates yet still another capacitive module 62 shown from a cross-sectional view. Referring to FIG. 5A, capacitive module 62 may be similar to capacitive module 22 described and illustrated with reference to FIG. 1B except that, for example, a conductive plane 65 with one or more insulating rings 66 replaces the one or more pair of conductive planes 15-1 and 15-2. Conductive plane 65 may be positioned above third insulating layer 13-3 and serve as a coupling region for the multi-stacked capacitive structures that comprise one or more pairs of the first electrodes and the second electrodes. Each of the first electrodes of capacitors 12-1, 12-2, and 12-3 may be electrically coupled to conductive plane 65 through one or more first conductive vias 10-1. However, one or more second conductive vias 10-2 are encircled by the insulating ring 66 on conductive plane 65, so that conductive vias 10-2 may be insulated from conductive plane 65 and electrically coupled to each of the second electrodes of capacitors 12-1, 12-2 and 12-3.

Figure 5B:
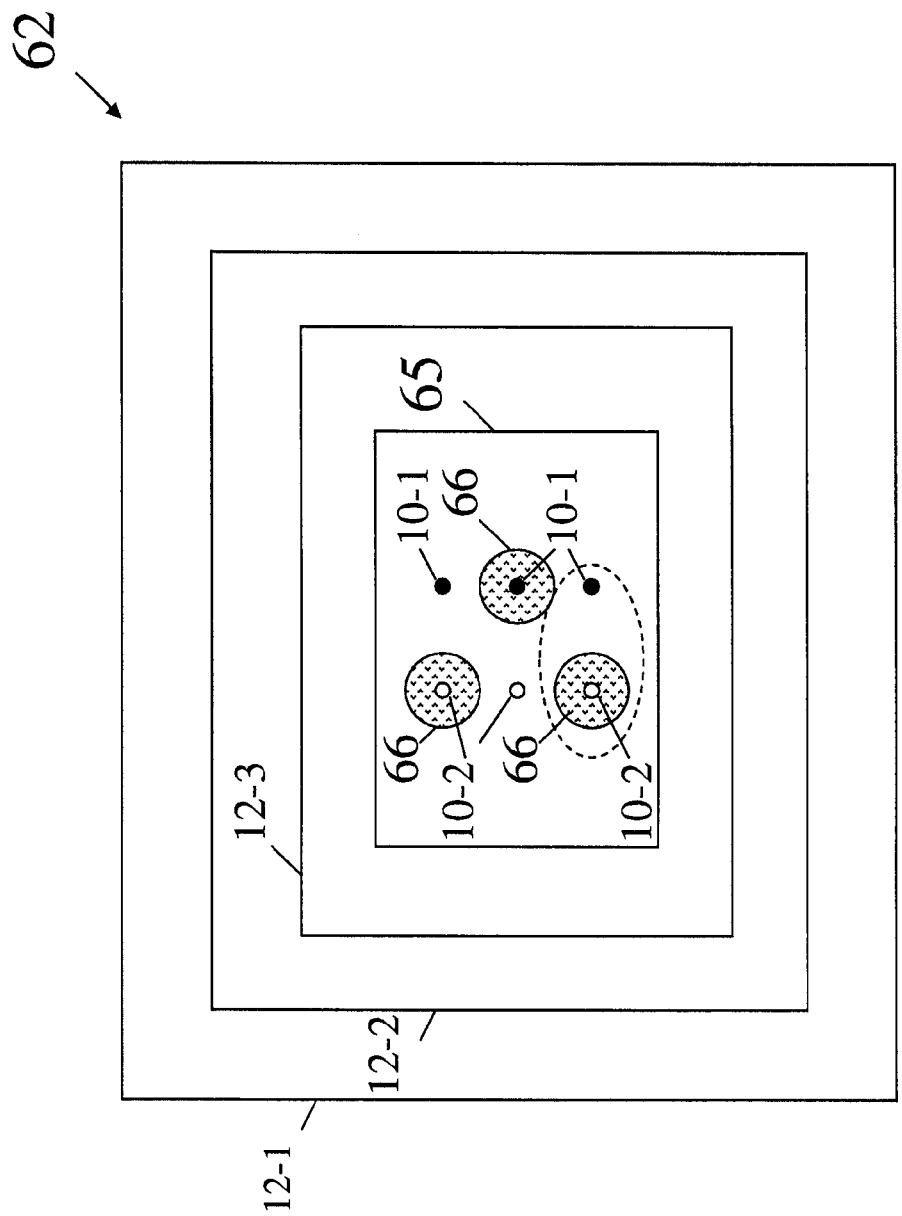
FIG. 5B is a schematic top view of the capacitor module illustrated in FIG. 5A.

FIG. 5B is a schematic top view of a capacitive module 62 illustrated in FIG. 5A. Referring to FIG. 5B, a first row of conductive vias 10-1 and a second row of conductive vias 10-2 may pass through conductive plane 65. Conductive vias 10-1 and 10-2 which are encircled by insulating rings 66 may be electrically isolated from conductive plane 65 and electrically coupled to the ground planes in a circuit board (not shown in FIG. 5B). However, the other conductive vias 10-1 and 10-2 that are not encircled by insulating rings 66 may be electrically coupled to conductive plane 65 and electrically coupled to the power planes in the circuit board (not shown in FIG. 5B). One of the conductive vias 10-1 electrically coupled to conductive plane 65 and one of the conductive vias 10-2 electrically isolated from conductive plane 65 may form a first pair of conductive vias. Magnetic flux induced from the first pair of conductive vias may be canceled out and thus the resultant inductance may be reduced. Similarly, one of the conductive vias 10-2 electrically coupled to conductive plane 65 and one of the conductive vias 10-1 electrically isolated from conductive plane 65 may form a second pair of conductive vias. Magnetic flux induced from the second pair of conductive vias may be canceled out and thus the resultant inductance may be reduced.

In addition, other pairings of conductive vias canceling magnetic flux and reducing inductance are possible. For example, one of the conductive vias 10-1 electrically coupled to conductive plane 65 and one of the conductive vias 10-1 electrically isolated from conductive plane 65 may form a third pair of conductive vias. Similarly, one of the conductive vias 10-2 electrically coupled to conductive plane 65 and one of the conductive vias 10-2 electrically isolated from conductive plane 65 may form a fourth pair of conductive vias. Magnetic flux induced from the third and fourth pairs of conductive vias may be also canceled out and the resultant inductance may be reduced.

As shown in FIG. 5B, insulating rings 66 are arranged on conductive vias 10-1 and 10-2 such that insulating rings provided on conductive vias 10-1 are offset from insulating rings 66 provided on conductive vias 10-2. However, insulating rings 66 may be provided on conductive vias 10-1 and 10-2 in other patterns to cancel out at least a portion of the magnetic flux induced from pairs of conductive vias. For example, although not shown, insulating rings 66 may be arranged on conductive vias 10-1 and 10-2 such that insulating rings provided on conductive vias 10-1 are aligned with insulating rings 66 provided on conductive vias 10-2. Insulating rings 66 may also be provided only on conductive vias 10-1, or only provided on conductive vias 10-2.

FIG. 6A illustrates yet another schematic example of a capacitive module 72 shown from a cross-sectional view consistent with the present invention. Referring to FIG. 6A, capacitive module 72 may be similar to capacitive module 12 described and illustrated with reference to FIG. 1A except that, for example, a multi-tier structure replaces the 2-stacked capacitive structure. An example of a multi-tier capacitive module may be found in a Taiwanese patent application No. 096144117, entitled "Multi-Tier Capacitor Structure, Fabrication Method Thereof and Semiconductor Substrate Having the Same," filed on Nov. 21, 2007, assigned to the same assignee and incorporated herein by reference. Specifically, as shown in FIG. 6A, the multi-tier structure may include two tiers formed by second electrode 72-2 having multiple conductive sections with each section corresponding to a tier or step. For example, as shown in FIG. 6A the 2-tier structure may include a first electrode 72-1 and a second electrode 72-2. Second electrode 72-2 may include a first conductive tier or step 721 and a second conductive tier or step 722. In accordance with this embodiment, first conductive step 721 forms a first conductive step section of second electrode 72-2 and second conductive step 722 forms a second conductive step section of second electrode 72-2. In the 2-tier structure, a first capacitance may be provided between first electrode 72-1 and first conductive tier 721, and a second capacitance may be provided between first electrode 72-1 and second conductive tier 722. First electrode 72-1 may be electrically coupled to first conductive plane 15-1 having the first polarity through one or more first conductive vias 10-1, while second electrode 72-2 may be electrically coupled to second conductive plane 15-2 having the second polarity that is opposite to the first polarity through one or more second conductive vias 10-2.

FIG. 6B illustrates still another capacitive module 73 shown from a cross-sectional view. Referring to FIG. 6B, capacitive module 73 may be similar to capacitive module 72 described and illustrated with reference to FIG. 6A except that, for example, a 3-tier structure replaces the 2-tier structure. Specifically, second electrode 73-2 may have a third conductive tier or step 723 may be provided on the 2-tier structure to form a third conductive step section of second electrode 73-2. A third capacitance may be provided between first electrode 72-1 and third conductive tier 723. In one example, capacitive module 73 may have an equivalent circuit similar to that illustrated in FIG. 3C. With the first, second and third capacitances in the 3-tier capacitive structure, capacitive module 73 may provide multi-capacitance for different applications.

Figure 6C:
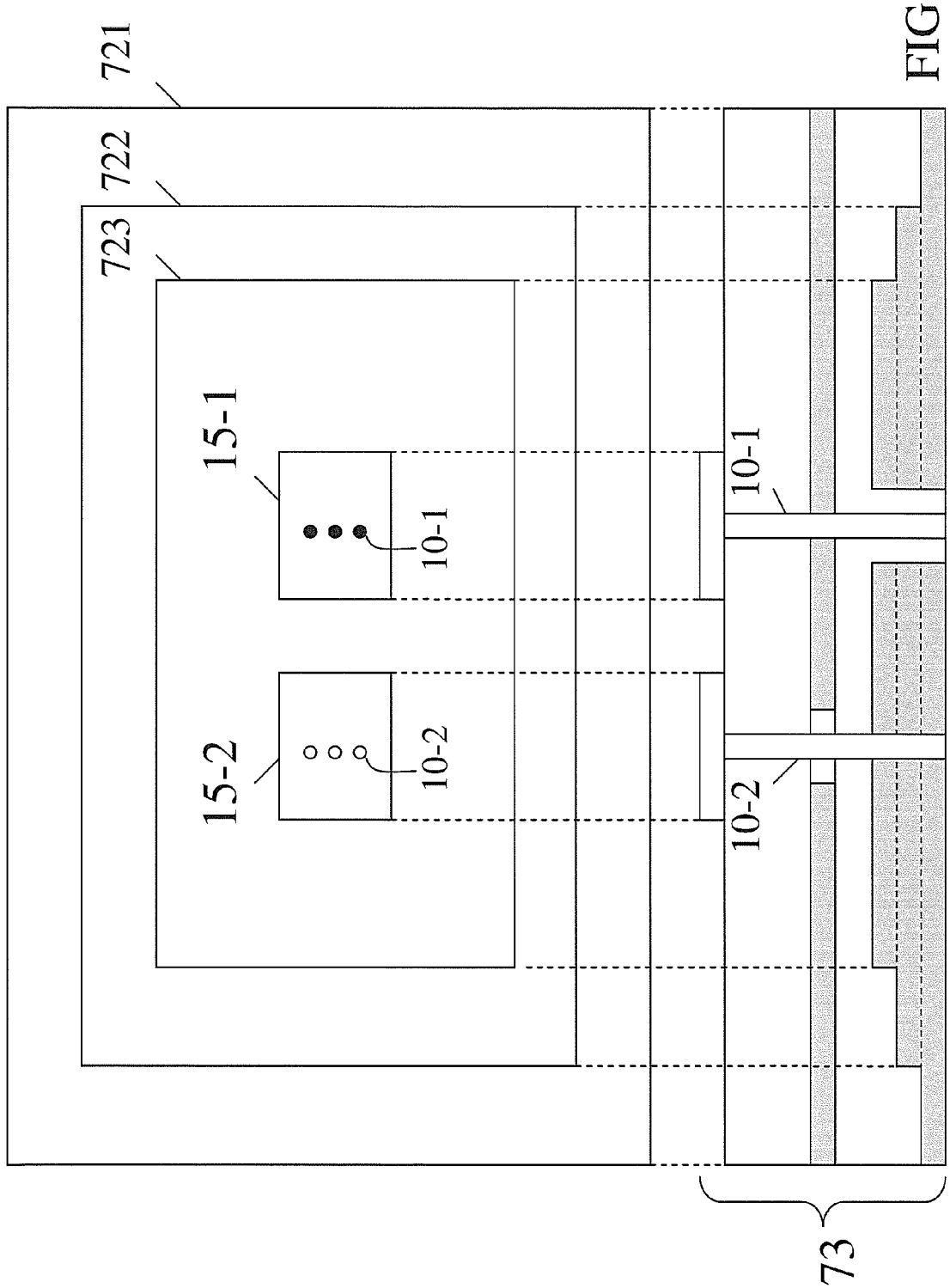
FIG. 6C is a schematic top view and a cross-sectional view of the capacitor module illustrated in FIG. 6B.

FIG. 6C is a schematic top view of capacitive module 73 illustrated in FIG. 6B. Referring to FIG. 6C, first conductive plane 15-1 may be electrically coupled to first electrode 72-1 through first conductive via 10-1. Furthermore, second conductive plane 15-2 may be electrically coupled to second electrode 72-2 through second conductive via 10-2. In accordance with disclosed embodiments, the configuration and arrangement of conductive planes 15-1 and 15-2 and conductive vias 10-1 and 10-2 may be similar to those illustrated in FIG. 3A. In another example, the configuration and arrangement of the conductive planes and the conductive vias in the multi-stacked capacitive structure described and illustrated with reference to FIG. 3B may be applicable to multi-tier structure in FIG. 6C.

Figure 7A:
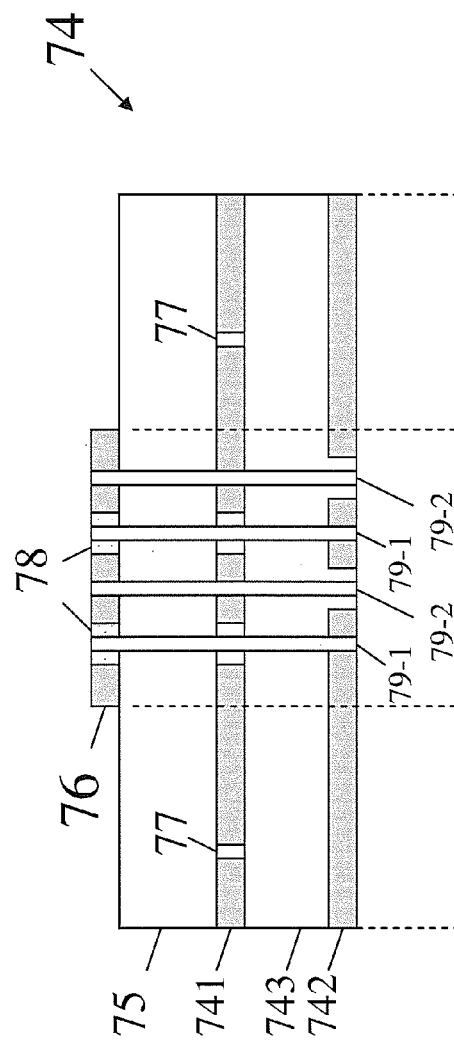
FIG. 7A illustrates still another capacitor module shown from a cross-sectional view according to a disclosed embodiment.

FIG. 7A illustrates still another capacitive module 74 shown from a cross-sectional view. Referring to FIG. 7A, capacitive module 74 may include a first electrode 741, a second electrode 742 and an insulating layer 743 between first electrode 741 and second electrode 742. A number of slots 77 may be formed on first electrode 741 and divide first electrode 741 into several regions $C_1$, $C_2$, $C_3$ and $C_4$, electrically isolated from one another. Examples of slots 77 may be found in the '413 application discussed above.

A conductive plane 76 may be positioned above first electrode 741 and separated from first electrode 741 by, for example, at least one insulating layer 75. Conductive plane 76 may serve as a coupling region for capacitive regions $C_1$, $C_2$, $C_3$ and $C_4$. One or more pairs of first conductive vias 79-1 and second conductive vias 79-2 may pass through each of capacitive regions $C_1$, $C_2$, $C_3$ and $C_4$. Conductive plane 76 may be electrically coupled to first electrode 741 through at least one of the second conductive vias 79-2. Furthermore, each of the first conductive vias 79-1 that are encircled by insulating rings 78 may be electrically isolated from conductive plane 76 and electrically coupled to second electrode 742. In accordance with disclosed embodiments, conductive plane 76 may be electrically coupled to first electrode 741 and power planes in a circuit board (not shown in FIG. 7A) through at least one of the second conductive vias 79-2. Furthermore, second electrode 742 may be electrically coupled to ground planes in the circuit board (not shown in FIG. 7A) through at least one of the first conductive vias 79-1.

Figure 7B:
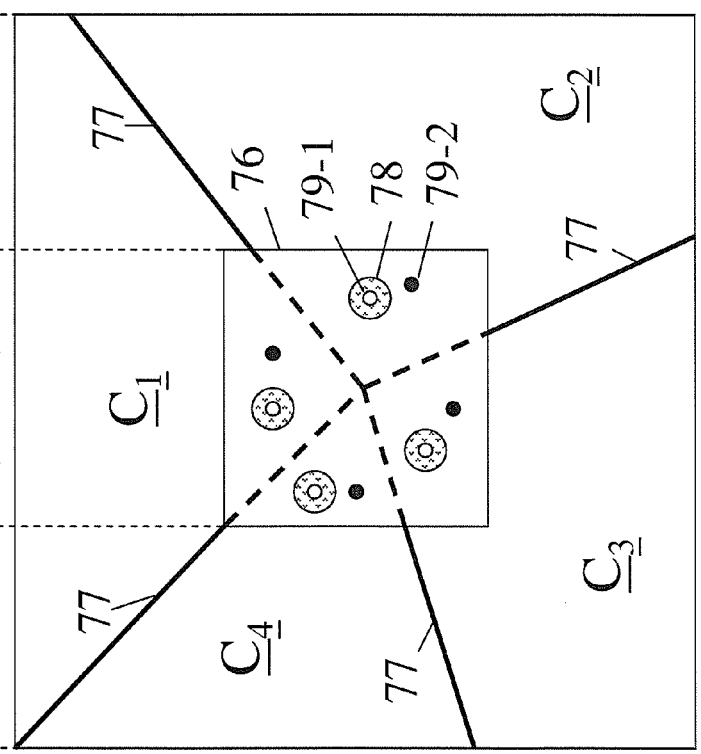
FIG. 7B is a schematic top view of the capacitor module illustrated in FIG. 7A.

FIG. 7B is a schematic top view of capacitive module 74 illustrated in FIG. 7A. Referring to FIG. 7B, slots 77 in this disclosed embodiment may divide the first electrode 741 into four capacitive regions $C_1$, $C_2$, $C_3$ and $C_4$, each of which may provide a capacitance. Capacitive regions $C_1$, $C_2$, $C_3$ and $C_4$ may be electrically coupled in parallel with one another so that the total capacitance may be increased and the inductance may be decreased. In another example, two or three capacitive regions may be formed by a different number of slots 77 and thus two or three capacitances coupled in parallel may be provided. In still another embodiment, more than four capacitive regions may be formed by a different number of slots 77 and thus more than four capacitances coupled in parallel may be provided.

Figure 8A:
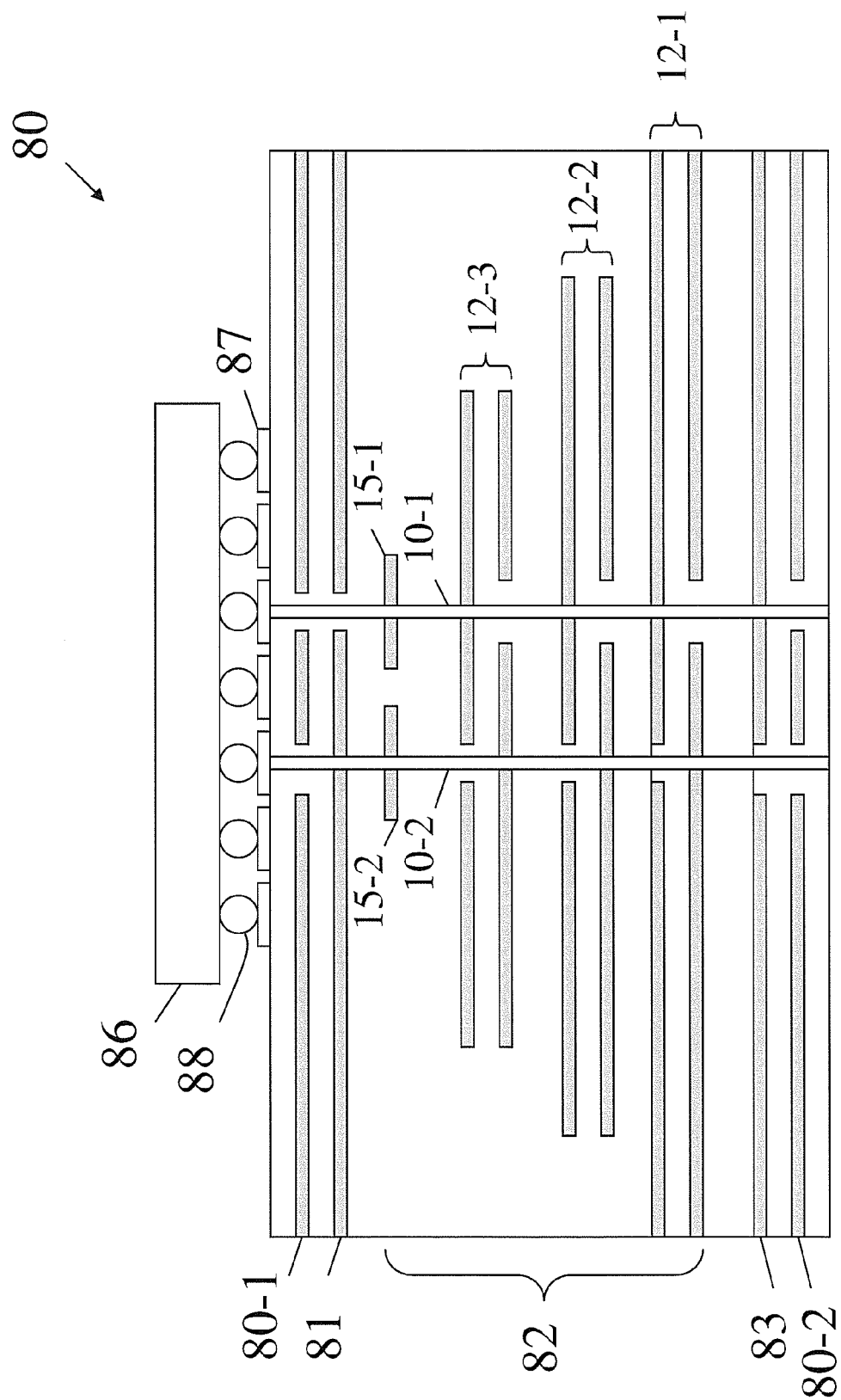
FIG. 8A illustrates yet another capacitor module embedded in a circuit board shown from a cross-sectional view according to a disclosed embodiment.

FIG. 8A illustrates yet another capacitive module 82 embedded or buried in a circuit board 80 shown from a cross-sectional view. Referring to FIG. 8A, circuit board 80 may include a first signal layer 80-1, a ground plane 81, capacitive module 82, a power plane 83 and a second signal layer 80-2. Capacitive module 82, in accordance with disclosed embodiments, may include a 3-stacked capacitive structure similar to capacitive module 22 described and illustrated with reference to FIG. 1B. Each first electrode of capacitors 12-1, 12-2 and 12-3 may be electrically coupled to first conductive plane 15-1 and power plane 83 through one or more first conductive vias 10-1. Likewise, each second electrode of capacitors 12-1, 12-2 and 12-3 may be electrically coupled to second conductive plane 15-2 and ground plane 81 through one or more second conductive vias 10-2. First and second conductive vias 10-1 and 10-2 are electrically coupled to the electronic component 86 through the conductive pads 87 and solder balls 88.

In one example, capacitive module 82, such as a multi-stacked capacitive structure including capacitors 12-1, 12-2 and 12-3, may be replaced by a multi-tier structure 72 and 73 such as one illustrated in FIG. 6A or 6B.

Figure 8B:
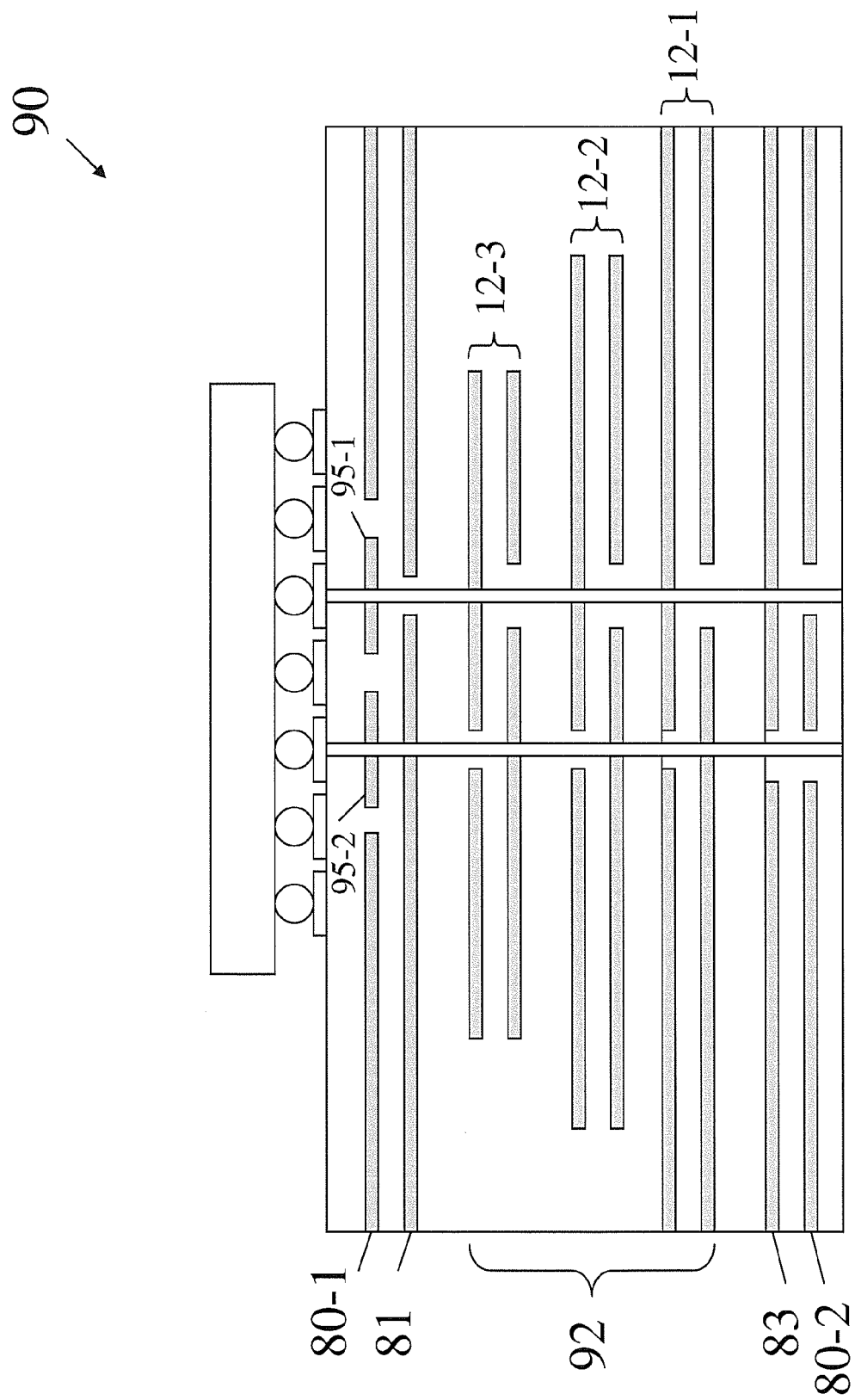
FIG. 8B illustrates still another capacitor module embedded in a circuit board shown from a cross-sectional view according to a disclosed embodiment.

FIG. 8B illustrates still another capacitive module 92 embedded or buried in a circuit board 90 shown from a cross-sectional view. Referring to FIG. 8B, capacitive module 92 may be similar to capacitive module 82 described and illustrated with reference to FIG. 8A except that, for example, a pair of conductive planes 95-1 and 95-2 replaces the pair of conductive planes 15-1 and 15-2. The conductive planes 95-1 and 95-2 may be located at first signal layer 80-1 and electrically isolated from the signal traces of first signal layer 80-1.

Figure 9:
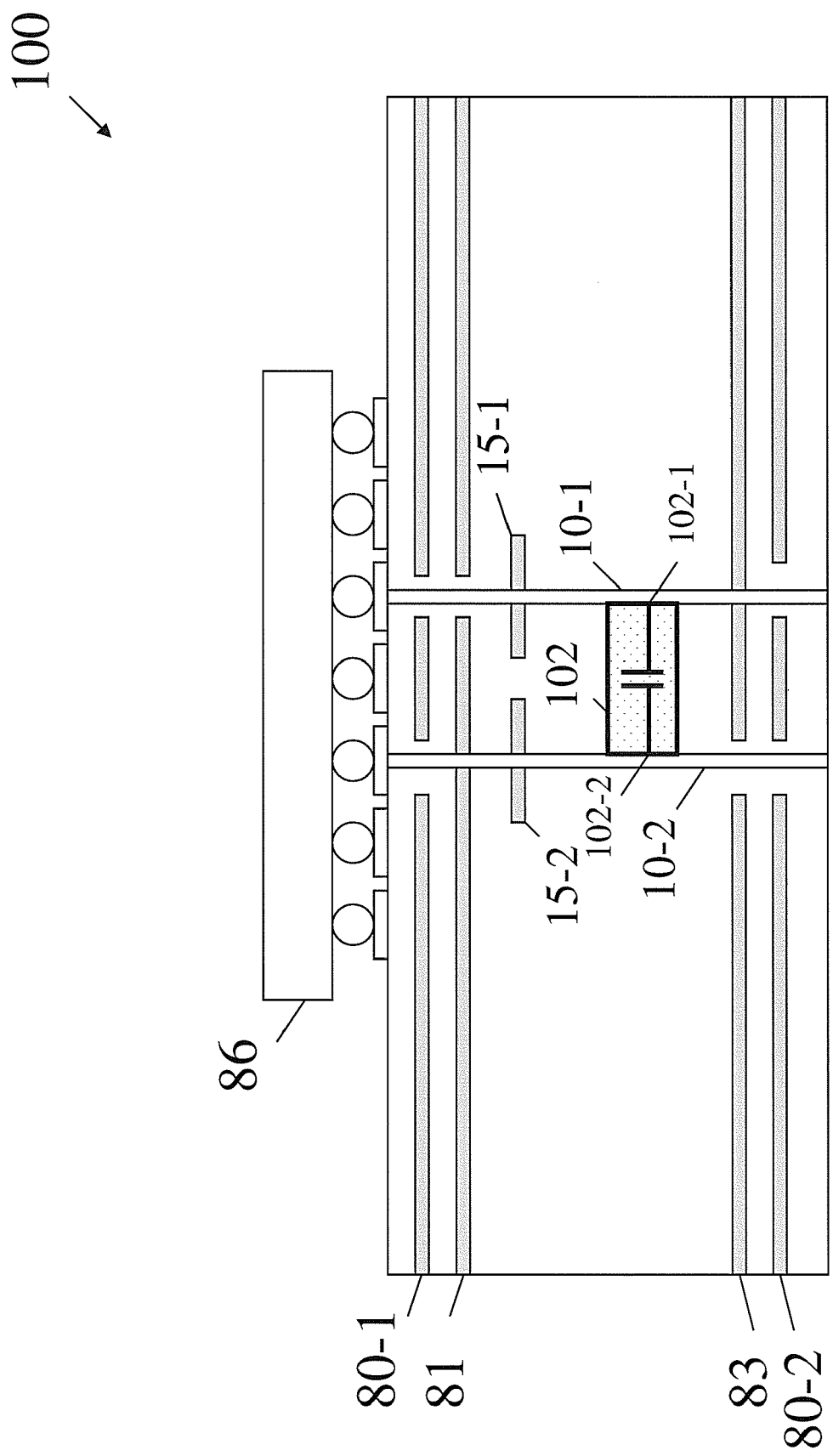
FIG. 9 illustrates yet another capacitor module embedded in a circuit board shown from a cross-sectional view according to a disclosed embodiment.

FIG. 9 illustrates yet another capacitive module 102 embedded or buried in a circuit board 100 shown from a cross-sectional view. Referring to FIG. 9, capacitive module 102 may include a discrete capacitive module such as one or more SMD capacitors or chip capacitors. Capacitive module 102 may be embedded in circuit board 100 during fabrication of circuit board 100 and electrically coupled to first electrode 15-1 and second electrode 15-2 through conductive vias 10-1 and 10-2, respectively. Specifically, capacitive module 102 may include a first electrode 102-1 coupled to one or more first conductive vias 10-1 and a second electrode 102-2 coupled to one or more second conductive vias 10-2.

In accordance with the disclosed embodiments, a capacitive module having one or more pairs of co-coupling electrodes, for example, first and second conductive planes 15-1 and 15-2 described and illustrated in FIG. 1B, may be coupled with or embedded within rigid or flexible printed circuit boards or other microelectronic devices such as chip packages.

In describing the disclosed embodiments, a description herein may have presented a method and/or process as a particular sequence of steps. However, to the extent that any method or process described herein does not rely on the particular order of steps set forth herein, the method or process should not be limited to the particular sequence of steps described. As one of ordinary skill in the art would appreciate, other sequences of steps may be possible. Therefore, the particular order of the steps set forth herein should not be construed as limitations on the claims. In addition, any claims directed to the method and/or process according to the disclosed embodiments should not be limited to the performance of their steps in the order written, and one skilled in the art can readily appreciate that the sequences may be varied and still remain within the spirit and scope of the disclosed embodiments.

It will be appreciated by those skilled in the art that changes could be made to the disclosed embodiments described above without departing from the broad inventive concept thereof. It is understood, therefore, that the disclosed embodiments are not limited to the particular examples disclosed, but it is intended to cover modifications within the spirit and scope of the disclosed embodiments as defined by the claims that follow.

What is claimed is:

1. A capacitive module, comprising:
  a first capacitor including a first electrode and a second electrode, one of the first electrode and the second electrode being coupled to at least one first conductive via and the other one of the first electrode and the second electrode being coupled to at least one second conductive via;
  a second capacitor spaced apart from the first capacitor, the second capacitor including a third electrode and a fourth electrode, one of the third electrode and the fourth electrode being coupled to the at least one first conductive via and the other one of the third electrode and the fourth electrode being coupled to the at least one second conductive via;
  a first conductive plane being electrically coupled to a first plane with a first polarity through one of the at least one first conductive via;
  a second conductive plane separated from the first conductive plane on the same plane as the first conductive plane, the second conductive plane being electrically coupled to a second plane with a second polarity through one of the at least one second conductive via, the first polarity being opposite to the second polarity,
    wherein the first conductive plane includes at least one first finger tab and the second conductive plane includes at least one second finger tab, and the at least one first finger tab and the at least one second finger tab are interdigitated with each other.

2. The capacitive module of claim 1, further comprising:
a first plurality of conductive vias including the at least one first conductive via, the first plurality of conductive vias being electrically connected to the first conductive plane; and
a second plurality of conductive vias including the at least one second conductive via, the second plurality of conductive vias being electrically connected to the second conductive plane;
wherein the first plurality of conductive vias forms a first row of vias located in the at least one first finger tab, and the second plurality of conductive vias forms a second row of vias in the at least one second finger tab, and
vias of the first and second rows of vias forms respective pairs in such a manner as to cancel their respective magnetic fluxes.

3. The capacitive module of claim 2, wherein the first row of vias is arranged near the second row of vias.

4. The capacitive module of claim 1 further comprising a third capacitor being positioned above the second capacitor, wherein the third capacitor includes a fifth electrode and a sixth electrode, one of the fifth electrode and the sixth electrode being coupled to the at least one first conductive via and the other one of the fifth electrode and the sixth electrode being coupled to the at least one second conductive via.

5. The capacitive module of claim 1, wherein the capacitive module is embedded in a circuit board having at least a power plane, a ground plane, and a signal trace layer, and the first conductive plane and the second conductive plane are located at the power plane, the ground plane, the signal-trace layer or between the first and second capacitor.

6. The capacitive module of claim 5, wherein the circuit board comprises a rigid circuit board, a flexible circuit board, a printed circuit board, or a chip package.

7. The capacitive module of claim 1, further comprising:
a first row of a first plurality of conductive vias including the at least one first conductive via, the first plurality of vias being electrically coupled to the first conductive plane; and
a second row of a second plurality of conductive vias including the at least one second conductive via, the second plurality of vias being electrically coupled to the first conductive plane; wherein
insulating rings are provided around the first and second plurality of conductive vias in a predetermined pattern to cancel at least a portion of the respective magnetic flux induced by the first plurality of conductive vias and the second plurality of conductive vias.

8. The capacitive module of claim 7, wherein the predetermined pattern comprises at least one of:
insulating rings provided on every other conductive via of the first plurality of conductive vias and insulating rings provided on every other conductive via of the second plurality of conductive vias, such that insulating rings provided on the first plurality of conductive vias in the first row are aligned with the insulating rings provided in the second plurality of conductive vias in the second row;
insulating rings provided on every other conductive via of the first plurality of conductive vias and insulating rings provided on every other conductive via of the second plurality of conductive vias, such that insulating rings provided on the first plurality of conductive vias in the first row are offset from the insulating rings provided in the second plurality of conductive vias in the second row; or
insulating rings provided only on the first plurality of conductive vias or the second plurality of conductive vias.

9. A capacitive module comprising:
a first capacitor including a first electrode and a second electrode, one of the first electrode and the second electrode being coupled to at least one first conductive via and the other one of the first electrode and the second electrode being coupled to at least one second conductive via;
a second capacitor spaced apart from the first capacitor, the second capacitor including a third electrode and a fourth electrode, one of the third electrode and the fourth electrode being coupled to the at least one first conductive via and the other one of the third electrode and the fourth electrode being coupled to the at least one second conductive via;
a first conductive plane being electrically coupled to a first plane with a first polarity through one of the at least one first conductive via;
a second conductive plane separated from the first conductive plane on the same plane as the first conductive plane, the second conductive plane being electrically coupled to a second plane with a second polarity through one of the at least one second conductive via, the first polarity being opposite to the second polarity,
a first plurality of conductive vias including the at least one first conductive via, the first plurality of vias being electrically coupled to the first conductive plane; and
a second plurality of conductive vias including the at least one second conductive via, the second plurality of vias being electrically coupled to the second conductive plane;
wherein the first plurality of conductive vias forms a first row of vias in the first conductive plane and the second plurality of conductive vias forms a second row of vias in the second conductive plane, and
individual conductive vias of the first and second rows of vias forming respective pairs in such a manner as to cancel the magnetic flux respectively associated with the individual conductive vias forming the first and second pluralities of conductive vias.

10. A capacitive module, comprising:
a first electrode having a first polarity;
a second electrode formed below the first electrode and having a second polarity, the second polarity being opposite to the first polarity;
a third electrode electrically coupled to the first electrode through a first conductive via;
a fourth electrode formed below the third electrode and being electrically coupled to the second electrode through a second conductive via;
a first conductive plane electrically coupled to the first electrode through the first conductive via;
a first row of a first plurality of conductive vias including the at least one first conductive via, the first plurality of vias being electrically coupled to the first conductive plane; and
a second row of a second plurality of conductive vias including the at least one second conductive via, the second plurality of vias being electrically coupled to the first conductive plane;
wherein insulating rings are provided around the first and second plurality of conductive vias in a predetermined pattern to cancel at least a portion of the respective magnetic flux of the conductive vias.

11. The capacitive module of claim 10, further comprising:
a second conductive plane electrically coupled to the second electrode through the second conductive via.

12. The capacitive module of claim 11, wherein
the first and second electrode form a first capacitor having a first capacitance; and
the third and fourth electrode form a second capacitor having a second capacitance.

13. The capacitive module of claim 12, further comprising:
an insulating layer formed over the first capacitor, the second capacitor being formed over the insulating layer.

14. The capacitive module of claim 13, further comprising:
a fifth electrode coupled to the first electrode, the third electrode, and the first conductive plane through the first conductive via; and
a sixth electrode formed below the fifth electrode and being coupled to the second electrode, the fourth electrode, and the second conductive plane through the second conductive via.

15. The capacitive module of claim 14, wherein
the first and second electrode form a first capacitor having a first capacitance;
the third and fourth electrode form a second capacitor having a second capacitance; and
the fifth and sixth electrode form a third capacitor having a third capacitance.

16. The capacitive module of claim 15, further comprising:
a first insulating layer formed over the first capacitor, the second capacitor being formed over the first insulating layer;
a second insulating layer formed over the second capacitor, the third capacitor being formed over the second insulating layer; and
a third insulating layer formed over the third capacitor, the first and second conductive planes being formed over the third insulating layer.

17. The capacitive module of claim 12, further comprising:
a first insulating layer, the first capacitor being formed over a first side of the first insulating layer, and the first and second conductive planes being formed over a second side of the first insulating layer; and
a second insulating layer formed over the first capacitor, the second capacitor being formed over the second insulating layer.

18. The capacitive module of claim 15, further comprising:
a first insulating layer, the first capacitor being formed over a first side of the first insulating layer, and the first and second conductive planes being formed over a second side of the first insulating layer;
a second insulating layer formed over the first capacitor, the second capacitor being formed over the second insulating layer; and
a third insulating layer formed over the second capacitor, the third capacitor being formed over the third insulating layer.

19. The capacitive module of claim 10, wherein
a insulating ring surrounds at least one of the first conductive via or the second conductive via.

20. The capacitive module of claim 10, wherein the capacitive module is embedded in a printed circuit board.

21. The capacitive module of claim 20, wherein the circuit board comprises a rigid circuit board, a flexible circuit board, a printed circuit board, or a chip package.

22. The capacitive module of claim 11, wherein the first conductive plane and the second conductive plane is formed on a power planer of a circuit board, a ground plane of a circuit board, or a signal-trace layer of a circuit board.

23. The capacitive module of claim 10, wherein the predetermined pattern comprises at least one of:
insulating rings provided on every other conductive via of the first plurality of conductive vias and insulating rings provided on every other conductive via of the second plurality of conductive vias, such that insulating rings provided on the first plurality of conductive vias in the first row are aligned with the insulating rings provided in the second plurality of conductive vias in the second row;
insulating rings provided on every other conductive via of the first plurality of conductive vias and insulating rings provided on every other conductive via of the second plurality of conductive vias, such that insulating rings provided on the first plurality of conductive vias in the first row are offset from the insulating rings provided in the second plurality of conductive vias in the second row; or
insulating rings provided only on the first plurality of conductive vias or the second plurality of conductive vias.

* * * * *